US007763545B2

(12) United States Patent
Kikuchi et al.

(10) Patent No.: US 7,763,545 B2
(45) Date of Patent: Jul. 27, 2010

(54) SEMICONDUCTOR DEVICE MANUFACTURING METHOD

(75) Inventors: Hideaki Kikuchi, Kawasaki (JP); Genichi Komuro, Kawasaki (JP); Mitsuhiro Endo, Chigasaki (JP); Naoki Hirai, Chigasaki (JP)

(73) Assignees: Fujitsu Semiconductor Limited, Yokohama (JP); ULVAC, Inc., Chigasaki (JP)

( * ) Notice: Subject to any disclaimer, the term of this patent is extended or adjusted under 35 U.S.C. 154(b) by 282 days.

(21) Appl. No.: 10/372,275

(22) Filed: Feb. 25, 2003

(65) Prior Publication Data
US 2003/0162401 A1  Aug. 28, 2003

(30) Foreign Application Priority Data
Feb. 28, 2002 (JP) ............................. 2002-054439

(51) Int. Cl.
*H01L 21/302* (2006.01)
*H01L 21/461* (2006.01)

(52) U.S. Cl. .............................. 438/706; 257/E21.009; 257/E21.311; 257/E21.664; 257/E27.104

(58) Field of Classification Search ................. 438/381, 438/393, 396, 706, 707, 710, 715, 720, 722, 438/742
See application file for complete search history.

(56) References Cited

U.S. PATENT DOCUMENTS

| | | | | |
|---|---|---|---|---|
| 5,277,750 A * | 1/1994 | Frank | ........................ | 438/720 |
| 5,515,984 A | 5/1996 | Yokoyama et al. | | |
| 5,527,729 A | 6/1996 | Matsumoto et al. | | |
| 5,604,138 A | 2/1997 | Lee et al. | | |
| 5,605,637 A * | 2/1997 | Shan et al. | ...................... | 216/71 |
| 5,624,583 A | 4/1997 | Tokashiki et al. | | |
| 5,652,171 A * | 7/1997 | Nagano et al. | .................. | 438/3 |
| 5,840,200 A | 11/1998 | Nakagawa et al. | | |
| 6,004,882 A * | 12/1999 | Kim et al. | .................... | 438/706 |
| 6,027,861 A * | 2/2000 | Yu et al. | ...................... | 430/316 |
| 6,054,391 A | 4/2000 | Nam et al. | | |
| 6,077,450 A | 6/2000 | Lee | | |
| 6,100,201 A | 8/2000 | Maejima et al. | | |
| 6,169,009 B1 * | 1/2001 | Ju et al. | ...................... | 438/396 |

(Continued)

FOREIGN PATENT DOCUMENTS

CN  429452  4/2001

(Continued)

OTHER PUBLICATIONS

Rossnagel et al., Handbook of Plasma Processing, 1990, Noyes Publications, p. 209.*

(Continued)

*Primary Examiner*—Allan Olsen
(74) *Attorney, Agent, or Firm*—Westerman, Hattori, Daniels & Adrian, LLP

(57) ABSTRACT

In a semiconductor device manufacturing method having the etching step of an electrode material film constituting a capacitor using ferroelectric substance or high- dielectric substance, etching of a conductive film that acts as an electrode of the capacitor formed over a semiconductor substrate is carried out in an atmosphere containing bromine, and a heating temperature of the semiconductor substrate is set in a range of 300° C. to 600° C., otherwise etching of at least the conductive film is carried out in an atmosphere to which only hydrogen bromide and oxygen are supplied from an outside.

7 Claims, 10 Drawing Sheets

U.S. PATENT DOCUMENTS

| | | | |
|---|---|---|---|
| 6,265,318 B1 * | 7/2001 | Hwang et al. | 438/720 |
| 6,635,185 B2 * | 10/2003 | Demmin et al. | 216/64 |
| 6,682,944 B2 * | 1/2004 | Kikuchi et al. | 438/3 |
| 6,762,108 B2 * | 7/2004 | Gambino et al. | 438/396 |
| 2001/0053610 A1 * | 12/2001 | Athavale et al. | 438/710 |

FOREIGN PATENT DOCUMENTS

| | | |
|---|---|---|
| DE | 198 52 256 A1 | 5/1999 |
| EP | 0 786 805 A2 | 7/1997 |
| EP | 1 001 459 A2 | 5/2000 |
| JP | 8-45905 | 2/1996 |
| JP | 9-266200 A | 10/1997 |
| JP | 10-223604 A | 8/1998 |
| JP | 10-247724 A | 9/1998 |
| JP | 11-354505 A | 12/1999 |
| JP | 11-354510 | 12/1999 |
| JP | 2000-164567 A | 6/2000 |
| JP | 2001-36024 | 2/2001 |
| KR | 1995-0021258 A | 7/1995 |
| KR | 2000-0021845 A | 4/2000 |
| WO | WO 99/36956 A1 | 7/1999 |
| WO | WO 00/49650 A1 | 8/2000 |

OTHER PUBLICATIONS

Office Action from Taiwanese Patent Office dated Sep. 17, 2004, with partial English language translation.
EPO Communication dated Jun. 19, 2008.
Office Action issued in Japanese Appln. No. 2002-054439, dated Sep. 30, 2008.
European Search Report dated Jul. 4, 2007, issued in corresponding European Patent Application No. 03 25 1108.
Prior Art Information List, Jul. 30, 2007.

* cited by examiner

SEMICONDUCTOR DEVICE MANUFACTURING METHOD

CROSS-REFERENCE TO RELATED APPLICATIONS

This application is based upon and claims priority of Japanese Patent Application No. 2002-54439, filed on Feb. 28, 2002, the contents being incorporated herein by reference.

BACKGROUND OF THE INVENTION

1. Field of the Invention

The present invention relates to a semiconductor device manufacturing method and, more particularly, a semiconductor device manufacturing method having the etching step of an electrode material film constituting a capacitor which has ferroelectric substance or high-dielectric substance.

2. Description of the Prior Art

In recent years, it is concluded that the semiconductor memory employing the ferroelectric capacitor or the high-dielectric capacitor is promising. For example, the ferroelectric capacitor is formed by following steps.

First, as shown in FIG. 1A, the first metal film 102, the ferroelectric film 103, and the second metal film 104 are formed sequentially on the insulating film 101, and then the resist pattern 105 having the capacitor shape is formed on the second metal film 104.

Then, the second metal film 104, the ferroelectric film 103, and the first metal film 102 are etched sequentially by using the resist pattern 105 as a mask. According to this etching, as shown in FIG. 1B, the second metal film 104 is shaped into the upper electrode 104a of the capacitor 106, the ferroelectric film 103 is shaped into the dielectric film 103a of the capacitor 106, and the first metal film 102 is shaped into the lower electrode 102a of the capacitor 106.

Meanwhile, since the first metal film 102 constituting the lower electrode 102a is formed of the noble metal such as iridium, platinum, or the like or its oxide, the first metal film 102 has the poor reactivity at the room temperature and thus is etched mainly by the sputter reaction. As the etching gas in the sputter, mainly the mixed gas consisting of the inert gas such as argon and chlorine is employed.

If such metal film is etched by the sputter reaction, the conductive secure sidewall deposition (fence) adheres to the side surface of the capacitor 106.

Therefore, in order to suppress the formation of the fence, such a structure is employed that the inclination angle of the side surface of the capacitor 106 is set gentle by retreating the side surfaces of the resist pattern 105, otherwise the shape of the capacitor 106 is formed stepwise.

However, if the inclination angle of the side surface of the lower electrode of the capacitor is set gentle or the capacitor is formed stepwise, the size of the capacitor is increased to get the desired capacitance. Therefore, the miniaturization of the semiconductor device having the capacitor is interfered.

SUMMARY OF THE INVENTION

It is an object of the present invention to provide a semiconductor device manufacturing method of forming a side surface of a capacitor lower electrode into a shape that is more closely perpendicular to an underlying insulating film, not to form a fence on a side surface of a capacitor.

According to one aspect of the present invention, there is provided a manufacturing method of a semiconductor device comprising the steps of: forming an insulating film on a semiconductor substrate; forming a conductive film made of a noble metal or its oxide on the insulating film; and etching the conductive film in an atmosphere containing bromine while heating the semiconductor substrate.

Also, the above subjects can be overcome by providing a semiconductor device manufacturing method comprising the steps of forming an insulating film over a semiconductor substrate; forming a first conductive film on the insulating film; forming a dielectric film made of ferroelectric material or high-dielectric material on the first conductive film; forming a second conductive film on the dielectric film; forming a mask having a capacitor shape on the second conductive film; and etching the second conductive film, the dielectric film, and the first conductive film, which are exposed from the mask, sequentially to shape the second conductive film into a capacitor upper electrode and shape the first conductive film into a capacitor lower electrode; wherein etching of at least the first conductive film is carried out in an atmosphere containing bromine, and a heating temperature of the semiconductor substrate is set in a range of 300° C. to 600° C., or etching of at least the first conductive film is carried out in an atmosphere to which only hydrogen bromide and oxygen are supplied from an outside.

Next, advantages of the present invention will be explained.

According to the present invention, while supplying the single gas of $Br_2$ or the mixed gas consisting merely of HBr and $O_2$ to the etching atmosphere as the etching gas and also heating the semiconductor wafer to more than 300° C. to enhance the reactivity, the conductive film made of the noble metal or its oxide is patterned into the electrode by using the mask and the etching.

Therefore, the side surface of the electrode formed by patterning the conductive film can be shaped into the shape close to the perpendicularity to have more than 77 degree with respect to the underlying surface.

In addition, according to the present invention, the single gas of $Br_2$ or the mixed gas consisting merely of HBr and $O_2$ is supplied to the reaction atmosphere. Therefore, the electrode employing the noble metal or its oxide can be shaped into the perpendicular shape or the shape close to the perpendicularity rather than the prior art not to deteriorate the ferroelectric or high-dielectric capacitor and not to form the conductive fence on the side surface of the capacitor.

DESCRIPTION OF THE PREFERRED EMBODIMENT

An embodiment of the present invention will be explained with reference to the accompanying drawings hereinafter.

FIGS. 2A to 2J are sectional views showing steps of forming a semiconductor device according to an embodiment of the present invention.

Figure 1A:
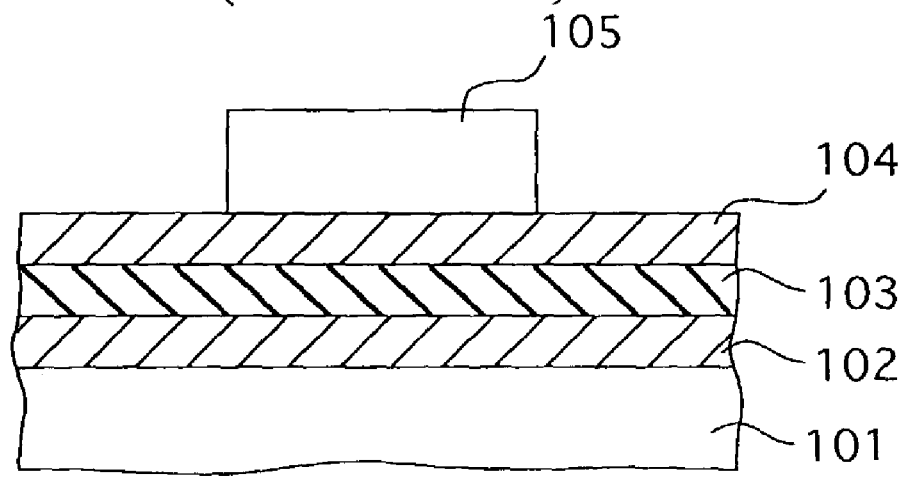
FIGS. 1A and 1B are sectional views showing steps of forming the capacitor in the prior art.
Figure 1B:
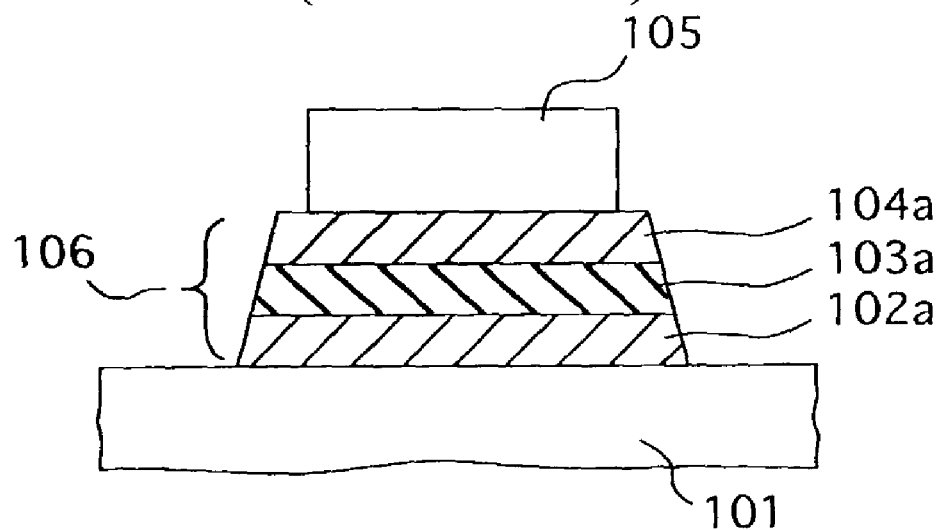
Figure 2A:
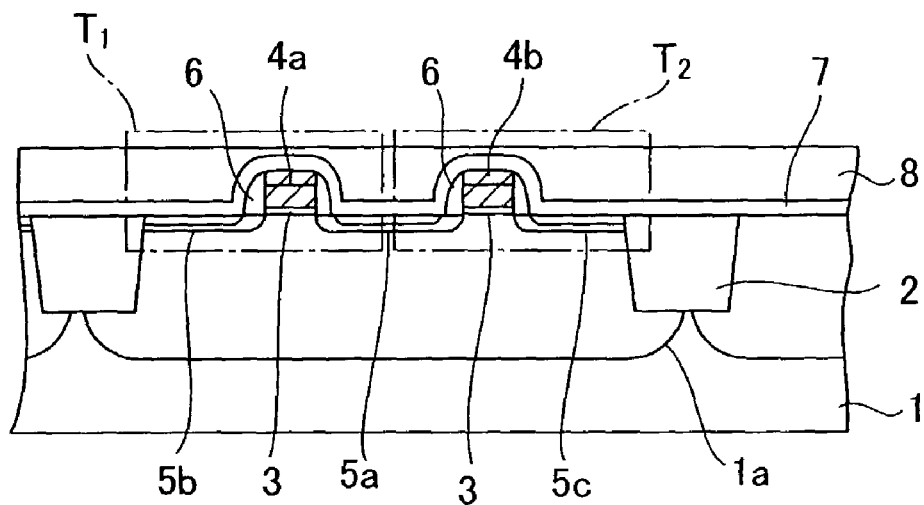
FIGS. 2A to 2J are sectional views showing steps of forming a semiconductor device according to an embodiment of the present invention.

First, steps required until a sectional structure shown in FIG. 2A is formed will be explained hereunder.

As shown in FIG. 2A, an element isolation recess is formed around a transistor forming region of an n-type of p-type silicon (semiconductor) substrate 1 by the photolithography method, and then an element isolation insulating film 2 is formed by burying silicon oxide ($SiO_2$) in the element isolation recess. The element isolation insulating film 2 having such structure is called STI (Shallow Trench Isolation). In this case, an insulating film formed by the LOCOS (Local Oxidation of Silicon) method may be employed as the element isolation insulating film.

Then, a p-type well 1a is formed by introducing the p-type impurity into the transistor forming region of the silicon substrate 1. Then, a silicon oxide film serving as a gate insulating film 3 is formed by thermally oxidizing a surface of the transistor forming region of the silicon substrate 1.

Then, an amorphous silicon or polysilicon film and a tungsten silicide film are formed sequentially on an overall upper surface of the silicon substrate 1. Then, gate electrodes 4a, 4b are formed by patterning the silicon film and the tungsten silicide film by virtue of the photolithography method.

In this case, two gate electrodes 4a, 4b are formed in parallel on one p-type well 1a, and these gate electrodes 4a, 4b constitute a part of the word line.

Then, first to third impurity diffusion regions 5a to 5c serving as source/drain are formed by ion-implanting the n-type impurity into the p-type well 1a on both sides of the gate electrodes 4a, 4b.

Then, an insulating film, e.g., a silicon oxide ($SiO_2$) film is formed on the overall surface of the silicon substrate 1 by the CVD method. Then, the insulating film is etched back and is left on both side portions of the gate electrodes 4a, 4b as an insulating sidewall spacer 6.

Then, the n-type impurity is ion-implanted into the first to third impurity diffusion regions 5a to 5c again by using the gate electrodes 4a, 4b and the sidewall spacers 6 as a mask, whereby the first to third impurity diffusion regions 5a to 5c have the LDD structure.

In this case, the first n-type impurity diffusion region 5a formed between two gate electrodes 4a, 4b in one transistor forming region is connected electrically to the bit line, while the second and third impurity diffusion regions 5b, 5c formed on both end sides of the transistor forming region are connected electrically to the lower electrode of the capacitor respectively.

According to the above steps, two MOS transistors $T_1$, $T_2$ having the gate electrodes 4a, 4b and the n-type impurity diffusion regions 5a to 5c having the LDD structure are formed in the p-type well 1a.

Then, a silicon oxide nitride (SiON) film of about 200 nm thickness is formed on the overall surface of the silicon substrate 1 by the plasma CVD method as a cover insulating film 7 that covers the MOS transistors $T_1$, $T_2$. Then, a silicon oxide ($SiO_2$) film of about 1.0 μm thickness is formed on the cover insulating film 7 as a first interlayer insulating film 8 by the plasma CVD method using the TEOS gas.

Then, as the densifying process of the first interlayer insulating film 8, such first interlayer insulating film 8 is thermally processed in the normal-pressure nitrogen atmosphere at the temperature of 700° C. for 30 minutes, for example. Then, an upper surface of the first interlayer insulating film 8 is planarized by the chemical mechanical polishing (CMP) method.

Figure 2B:
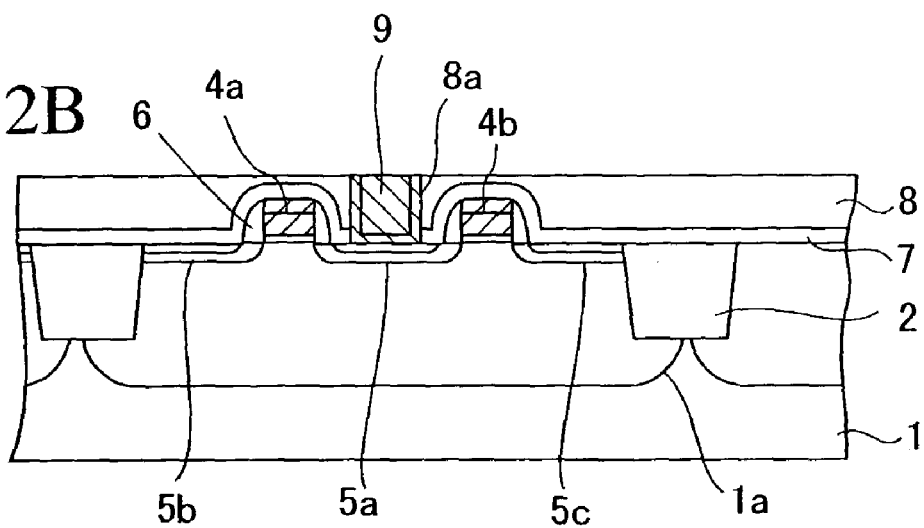

Next, steps required until a structure shown in FIG. 2B is formed will be explained hereunder.

First, a first contact hole 8a having a depth to reach the first n-type impurity diffusion region 5a is formed by patterning the cover insulating film 7 and the first interlayer insulating film 8 by means of the photolithography method. Then, a titanium (Ti) film of 30 nm thickness and a titanium nitride (TiN) film of 50 nm thickness are formed sequentially as a glue film on an upper surface of the first interlayer insulating film 8 and an inner surface of the first contact hole 8a by the sputter method. Then, a tungsten (W) film is grown on the TiN film by the CVD method using $WF_6$ to bury the first contact hole 8a completely.

Then, the W film, the TiN film, and the Ti film are polished by the CMP method to remove from an upper surface of the first interlayer insulating film 8. The W film, the TiN film, and the Ti film left in the first contact hole 8a are used as a first conductive plug 9.

Figure 2C:
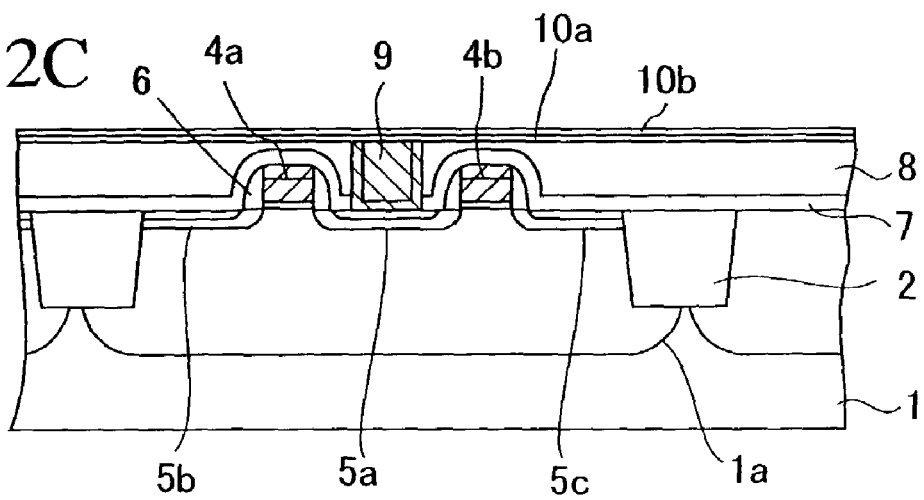

Then, as shown in FIG. 2C, an oxidation preventing insulating film 10a made of silicon nitride ($Si_3N_4$) of 100 nm thickness and an underlying insulating film 10b made of SiO$_2$ of 100 nm thickness are formed sequentially on the first interlayer insulating film 8 and the first conductive plug 9 by the plasma CVD method. The SiO$_2$ film is grown by the plasma CVD method using TEOS. The oxidation preventing insulating film 10a is formed to prevent the contact failure caused by the defective oxidation of the first conductive plug 9 in the thermal process such as the later annealing. It is desirable that a thickness of the oxidation preventing insulating film 10a should be set to more than 70 nm, for example.

Figure 2D:
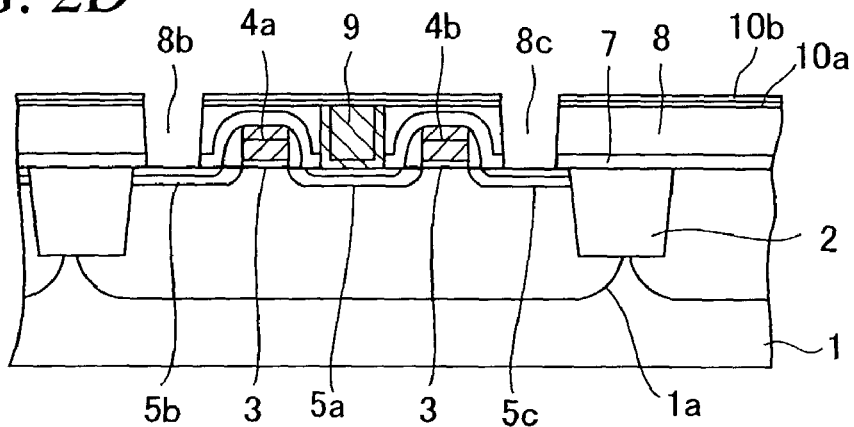

Then, as shown in FIG. 2D, second and third contact holes 8b, 8c are formed on the second and third impurity diffusion regions 5b, 5c by etching the oxidation preventing insulating film 10a, the underlying insulating film lob, and the first interlayer insulating film 8 while using the resist pattern (not shown) as a mask.

Then, the Ti film of 30 nm thickness and the TiN film of 50 nm thickness are formed sequentially as a glue film on an upper surface of the underlying insulating film 10b and inner surfaces of the second and third contact holes 8b, 8c by the sputter method. Then, the W film is grown on the TiN film by the CVD method to bury the second and third contact holes 8b, 8c completely.

Figure 2E:
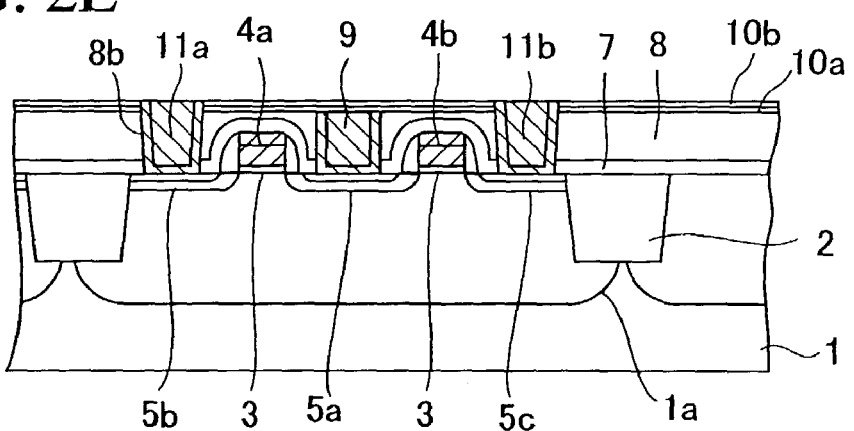

Then, as shown in FIG. 2E, the W film, the TiN film, and the Ti film are polished by the CMP method to remove from the upper surface of the underlying insulating film 10b. Accordingly, the W film, the TiN film, and the Ti film left in the second and third contact holes 8b, 8c are used as second and third conductive plugs 11a, 11b respectively.

Figure 2F:
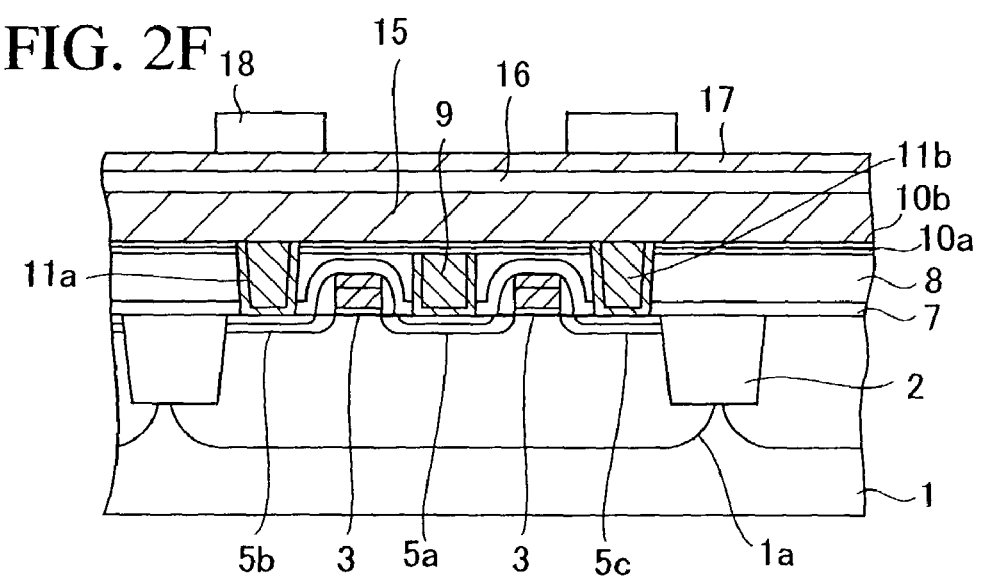

Next, steps required until a structure shown in FIG. 2F is formed will be explained hereunder.

First, an iridium (Ir) film, a platinum (Pt) film, a platinum oxide (PtO) film, an iridium oxide (IrO$_x$) film, or a SRO (strontium ruthenium oxygen) film having a thickness of 300 nm, for example, are formed on the second and third conductive plugs 11a, 11b and the underlying insulating film 10b as a first conductive film 15.

In this case, in order to prevent the peeling-off of the film, for example, the underlying insulating film 10b is annealed before or after the formation of the first conductive film 15. As the annealing method, RTA (Rapid Thermal Annealing) conducted in the argon atmosphere at 600 to 750° C., for example, is employed.

Then, a PZT film of 100 nm thickness, for example, is formed on the first conductive film 15 as a ferroelectric film 16 by the sputter method. As the method of forming the ferroelectric film 16, there are the MOD (Metal Organic Deposition) method, the MOCVD (Metal Organic CVD) method, the sol-gel method, etc. in addition to the above. Also, as the material of the ferroelectric film 16, there are PZT material such as PLCST, PLZT, etc., the Bi-layer structure compound material such as SrBi$_2$Ta$_2$O$_9$, SrBi$_2$(Ta, Nb)$_2$O$_9$, etc., the metal oxide ferroelectric substance, and others in addition to the PZT.

Then, the ferroelectric film 16 is crystallized by annealing in the oxygen atmosphere. As the annealing, the 2-step RTA process having the first step in which the annealing is executed at the substrate temperature of 600° C. for 90 seconds in the mixed gas atmosphere consisting of argon and oxygen and the second step in which the annealing is executed at the substrate temperature of 750° C. for 60 seconds in the oxygen atmosphere, for example, is employed.

In addition, an iridium oxide (IrO$_2$) film of 200 nm thickness, for example, is formed on the ferroelectric film 16 as a second conductive film 17 by the sputter method.

Then, a TiN film and a SiO$_2$ film are formed sequentially on the second conductive film 17 as hard masks 18. These hard masks 18 are patterned into a capacitor planar shape over the second and third conductive plugs 11a, 11b by the photolithography method.

Figure 2G:
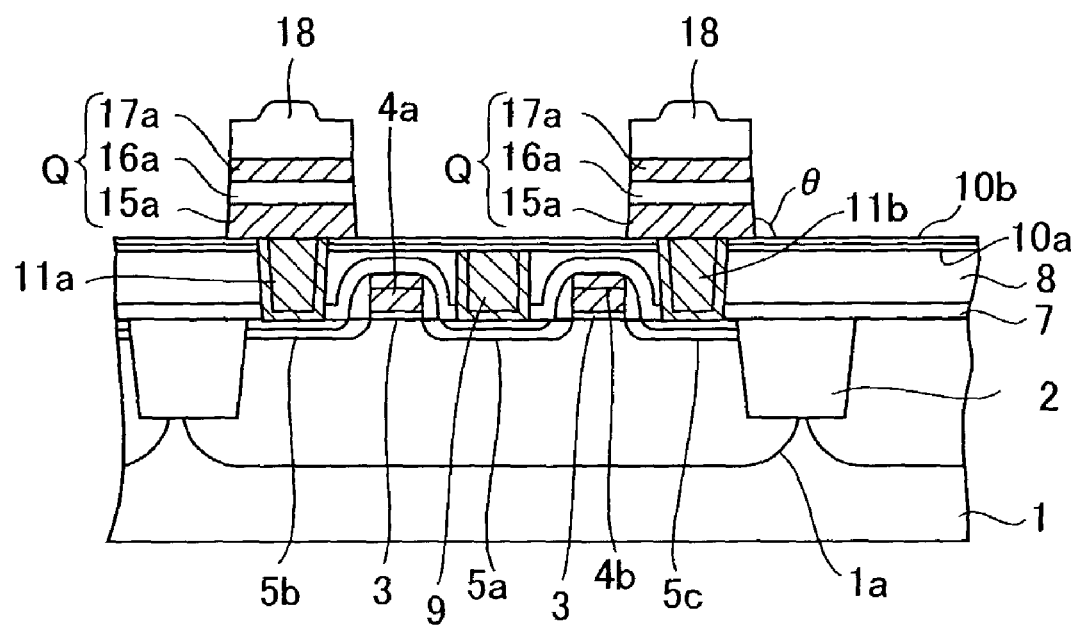

Then, as shown in FIG. 2G, the second conductive film 17, the ferroelectric film 16, and the first conductive film 15 in the region that is not covered with the hard mask 18 are etched sequentially. In this case, the ferroelectric film 16 is etched by the sputter reaction in the atmosphere containing chlorine and argon. Also, the second conductive film 17 and the first conductive film 15 are etched by the sputter reaction in the atmosphere into which the bromine (Br$_2$) is introduced, the atmosphere containing Br, or the atmosphere into which only HBr and oxygen are introduced.

With the above, lower electrodes 15a of the capacitors Q made of the first conductive film 15, dielectric films 16a of the capacitors Q made of the ferroelectric film 16, and upper electrodes 17a of the capacitors Q made of the second conductive film 17 are formed on the oxidation preventing insulating film 10a. Then, in the transistor forming region, one lower electrode 15a is connected electrically to the second impurity diffusion region 5b via the second conductive plug 11a, and the other lower electrode 15a is connected electrically to the third impurity diffusion region 5c via the third conductive plug 11b. Also, a taper angle θ of the side surface of the capacitor Q to the lower electrode 15a becomes about 80 degree.

After this, the hard masks 18 are removed.

Then, in order to recover the damage of the ferroelectric film 16 caused by the etching, the recovery annealing is carried out. The recovery annealing in this case is carried out in the oxygen atmosphere at the substrate temperature of 650° C. for 60 minutes, for example.

Figure 2H:
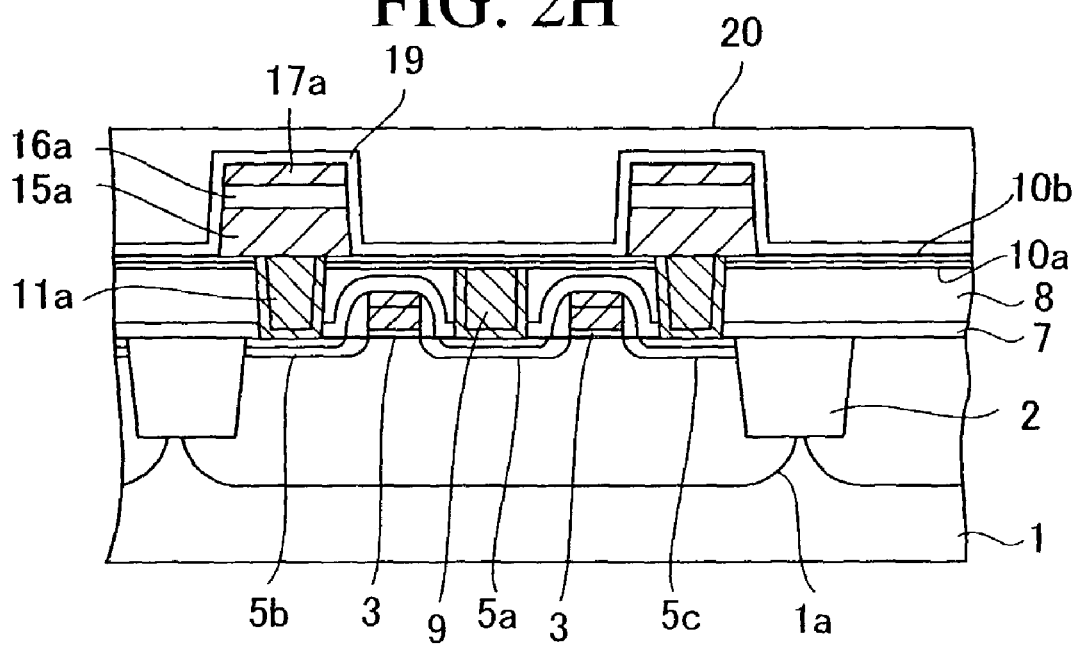

Then, as shown in FIG. 2H, an alumina film of 50 nm thickness is formed on the underlying insulating film 10b by the sputter as a protection film 19 for covering the capacitors Q. Then, the capacitors Q are annealed in the oxygen atmosphere at 650° C. for 60 minutes. This protection film 19 protects the capacitors Q from the process damage.

Then, a silicon oxide (SiO$_2$) film of about 1.0 μm thickness is formed on the protection film 19 as a second interlayer insulating film 20 by the plasma CVD method using the TEOS gas. In addition, an upper surface of the second interlayer insulating film 20 is planarized by the CMP method. In this example, a remaining thickness of the second interlayer insulating film 20 after the CMP is almost 300 nm on the upper electrodes 17a of the capacitors Q.

Figure 2I:
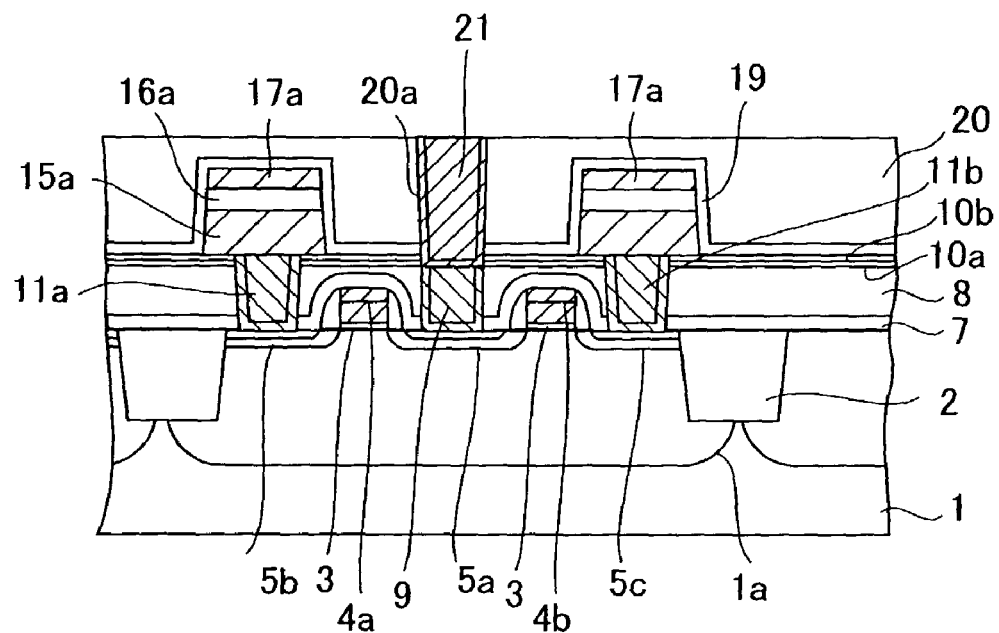

Then, as shown in FIG. 2I, a hole 20a is formed on the first conductive plug 9 by etching the second interlayer insulating film 20, the protection film 19, the oxidation preventing insulating film 10a, and the underlying insulating film 10b while using the resist mask (not shown) as a mask.

Then, a TiN film of 50 nm thickness is formed in the hole 20a and on the second interlayer insulating film 20 as a glue film by the sputter method. Then, a W film is grown on the glue film by the CVD method to bury the hole 20a perfectly.

Then, the W film and the TiN film are polished by the CMP method to remove from an upper surface of the second interlayer insulating film 20. Then, the tungsten film and the glue film being left in the hole 20a are used as a fourth conductive plug 21. This fourth conductive plug 21 is connected electrically to the first impurity diffusion region 5a via the first conductive plug 9.

Figure 2J:
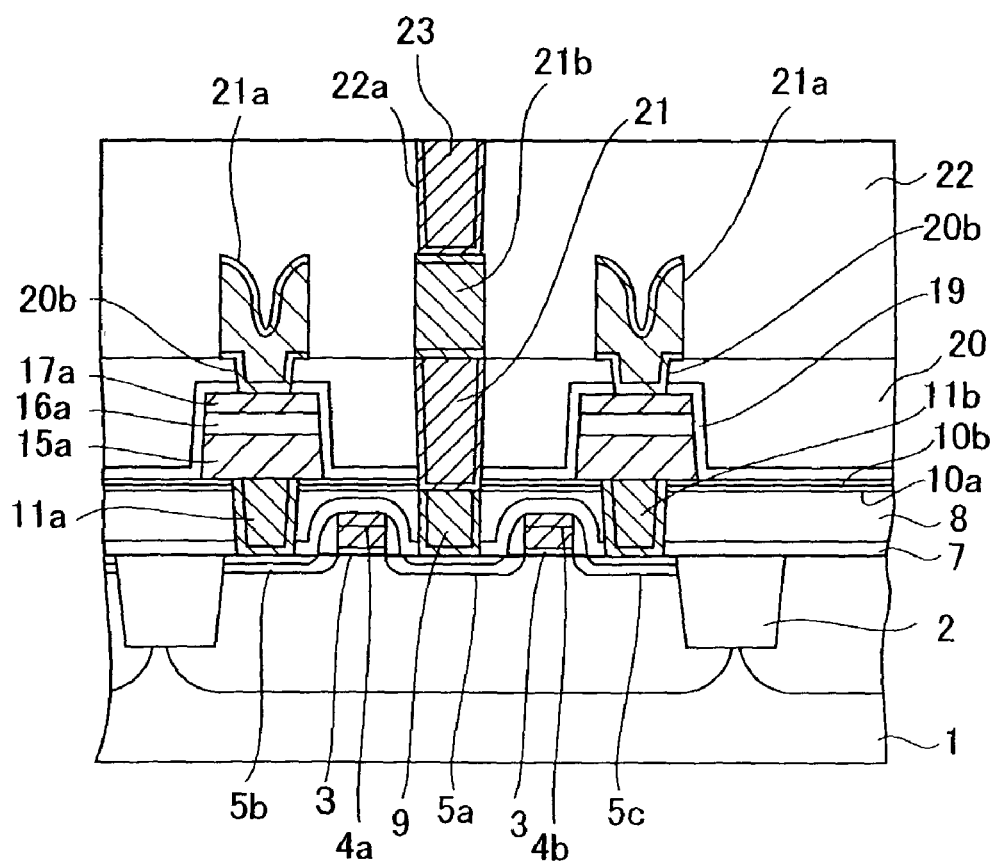

Next, steps required until a structure shown in FIG. 2J is formed will be explained hereunder.

First, a SiON film is formed on the fourth conductive plug 21 and the second interlayer insulating film 20 as a second oxidation preventing film (not shown) by the CVD method.

Then, contact holes 20b are formed on the upper electrodes 17a of the capacitors Q by patterning the second oxidation preventing film and the second interlayer insulating film 20 by virtue of the photolithography method.

The capacitors Q that are subjected to the damage by forming the contact holes 20b are recovered by the annealing. This annealing is carried out in the oxygen atmosphere at the substrate temperature of 550° C. for 60 minutes, for example.

Then, the second oxidation preventing film formed on the second interlayer insulating film 20 is removed by the etching back to expose a surface of the fourth conductive plug 21.

Then, a multi-layered metal film is formed in the contact holes 20b formed on the upper electrodes 17a of the capacitors Q and on the second interlayer insulating film 20. Then, first-layer metal wirings 21a connected to the upper electrodes 17a via the contact holes 20b and a conductive pad 21b connected to the fourth conductive plug 21 are formed by patterning the multi-layered metal film. As the multi-layered metal film, a structure in which Ti of 60 nm thickness, TiN of 30 nm thickness, AlCu of 400 nm thickness, Ti of 5 nm thickness, and TiN of 70 nm thickness, for example, are formed sequentially is employed.

In this case, as the method of patterning the multi-layered metal film, the method of forming the reflection preventing film on the multi-layered metal film, then coating the resist on the reflection preventing film, then forming resist patterns such as the wiring shape, etc. by exposing/developing the resist, and then etching the reflection preventing film and the multi-layered metal film by using the resist patterns is employed.

Then, a third interlayer insulating film 22 is formed on the second interlayer insulating film 20, the first-layer metal wirings 21a, and the conductive pad 21b. In turn, a hole 22a is formed on the conductive pad 21b by patterning the third interlayer insulating film 22. Then, a fifth conductive plug 23 consisting of the TiN film and the W film sequentially from the bottom is formed in the hole 22a.

Then, although not particularly shown, a second-layer wiring containing the bit line is formed on the third interlayer insulating film 22. The bit line is connected electrically to the first impurity diffusion region 5a via the fifth conductive plug 23, the conductive pad 21b, the fourth conductive plug 21, and the first conductive plug 9. Subsequently to this, an insulating film for covering the second-layer wiring, etc. are formed, but their details will be omitted hereunder.

The above steps are the steps of forming the memory cell region of FeRAM. Next, mainly the etching of the first conductive film acting as the lower electrode of the capacitor will be explained in detail hereunder.

In order to shape the etched side surface of the first conductive film 15 into the shape that is closely perpendicular to the upper surface of the underlying insulating film 10b, it is effective to enhance the chemical reactivity between the etching gas and the etched material.

The etching gas and the etched material cause the chemical reaction in the plasma of the etching gas to generate the volatile substance and then such volatile substance is exhausted, so that the etched material is etched. Since the volatile reaction product does not adhere to the etched side surface and is exhausted, the etching shape that is close to the perpendicularity can be obtained.

In contrast, if the sputter action is employed, the etching product adheres to the etched film side surface (etched side surface) and then such etching product acts as the mask, so that it is difficult to shape the etched side surface into the perpendicular shape. In particular, if it is tried to get the shape, which is close to the perpendicularity, by etching the first conductive film 15, the ferroelectric film 16, and the second conductive film 17 using the sputter action, a conductive fence is formed on the etched side surface to cause the considerable reduction of the capacitor characteristics.

Accordingly, in order to execute the etching such that the first conductive film 15 and the second conductive film 17 made of the noble metal such as Ir, Pt or the like or its oxide can be shaped into the shape close to the perpendicularity not to form the fence on the etched side surface, it is important to enhance the chemical reactivity between the etching gas and the etched material by the method of increasing the temperature of the silicon substrate 1. In case the temperature of the silicon substrate 1 is set high, the hard mask made of the material other than the photoresist must be employed as the mask material because the photoresist has the poor heat resistance, and also the optimum etching gas must be employed.

First, the etching equipment employed in the patterning of the films constituting the capacitor will be explained with reference with FIG. 3 hereunder.

Figure 3:
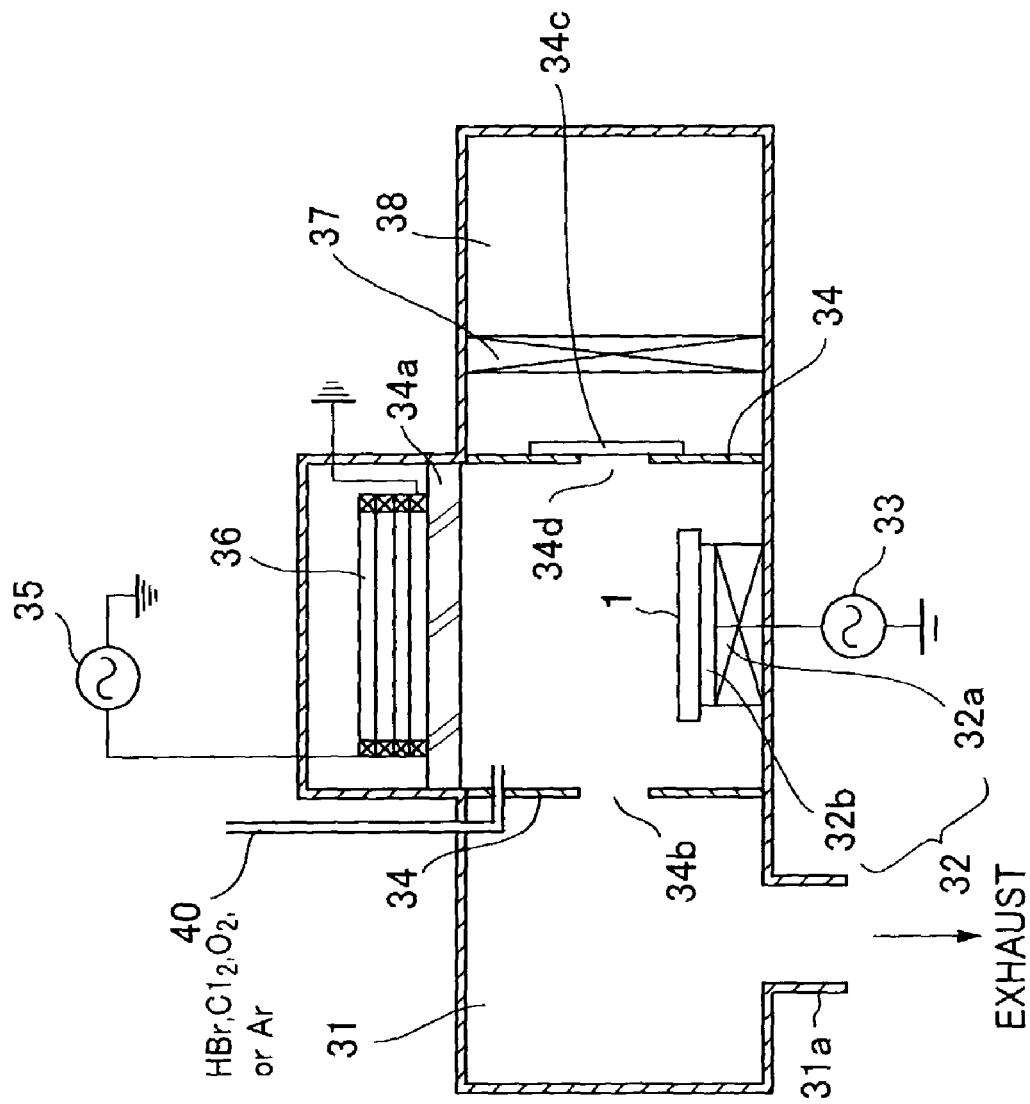
FIG. 3 is a configurative view showing an example of the etching equipment employed to form the semiconductor device according to the embodiment of the present invention.

The equipment shown in FIG. 3 is the ICP plasma etching equipment.

In FIG. 3, a wafer stage 32 is arranged in a low pressure chamber 31. This wafer stage 32 has a structure in which an electrostatic chuck 32b is loaded on a heater 32a. A first high-frequency power supply 33 is connected to this electrostatic chuck 32b.

Also, an almost-cylindrical adhesion preventing plate 34 for surrounding the wafer stage 32 is arranged in the low pressure chamber 31, and an upper portion of the adhesion preventing plate 34 is closed by a quartz plate 34a. Also, an antenna coil 36 to which a second high-frequency power supply 35 is connected is fitted onto the quartz plate 34a. The plasma is generated in the adhesion preventing plate 34 by applying the high-frequency electric power to the antenna coil 36. A gas introducing pipe 40 is connected to the etching atmosphere that is surrounded by the adhesion preventing plate 34 and the quartz plate 34a. In the etching steps shown in FIG. 2F and FIG. 2G, the gas that is suitable for respective etchings of the first conductive film 15, the ferroelectric film 16, and the second conductive film 17 is introduced. In this case, as the material constituting the first conductive film 15 and the second conductive film 17, the noble metal such as Ir, Pt, or the like or its oxide, which is chemically stable, is employed.

In addition, an exhausting pipe 31a is connected to the low pressure chamber 31, and an opening 34b is formed at the portion of the adhesion preventing plate 34, which is near the exhausting pipe 31a. A load lock chamber 38 is provided next to the low pressure chamber 31 via a gate valve 37. Then, a wafer loading port 34d, which is opened/closed by a shutter 34c, is formed at the portion of the adhesion preventing plate 34, which is near the load lock chamber 38.

Next, the etching of the electrode material film by using such etching equipment will be explained hereunder.

First, a relationship between an etching rate and a temperature was examined by etching an iridium (Ir) film used as the electrode material. As the etching conditions, the pressure in the adhesion preventing plate 34 was set to 0.5 Pa, the source power applied from the second high-frequency power supply 35 to the antenna coil 36 was set to 800 watt, and the temperature of the wafer stage 32 was changed in the range of 250° C. to 400° C.

Figure 4:
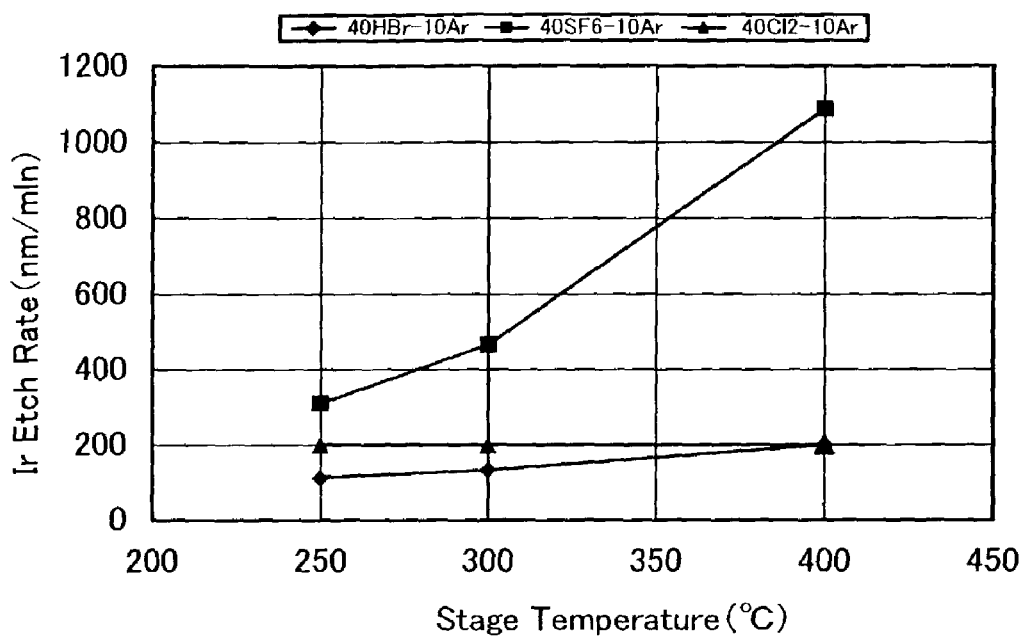
FIG. 4 is a graph showing a relationship between an etching rate of iridium used for the capacitor electrode of the semiconductor device according to the embodiment of the present invention and a stage temperature.

In FIG. 4, dependencies of the etching rate of the Ir film on the stage temperature according to the gases containing halogen, i.e., the mixed gas consisting of HBr and Ar, the mixed gas consisting of $SF_6$ and Ar, and the mixed gas consisting of $Cl_2$ and Ar respectively are shown.

The etching rate of the Ir film exhibited the temperature dependency with respect to HBr and $SF_6$, but such etching rate did not exhibit the temperature dependency with respect to $Cl_2$. Accordingly, it is possible to say that the improvement in the chemical reactivity cannot be expected by $Cl_2$ if the temperature of the wafer stage 32 is raised but the chemical reactivity can be improved by HBr and $SF_6$ if the temperature of the wafer stage 32 is raised.

Therefore, it may be concluded that, if the temperature of the wafer stage 32 is raised while using HBr or $SF_6$, the noble metal such as Ir, Pt, or the like or its oxide can be etched into the shape close to the perpendicularity by the chemical reaction. However, there were problems such that the material of the hard mask is etched and is not held because the reactivity of $SF_6$ is too strong, it is difficult to control the etching rate stably, etc. As a result, the experiments were carried out while using the HBr gas particularly. The contents of the experiments will be explained in the following.

If the gas containing the hydrogen such as HBr is used as the etching gas, there is apprehension that the capacitor performance of the ferroelectric material such as PZT constituting the ferroelectric film 16 is deteriorated by the influence of the hydrogen contained in the etching gas.

Therefore, the inventors of the present invention considered that the influence of the hydrogen can be eliminated by reacting the hydrogen with the oxygen to produce the water. Since the boiling point of the water is low, such water can be easily volatilized if the temperature of the water is increased at the low pressure. As a result, the inventors of the present invention concluded that the hydrogen is not contained in the ferroelectric capacitor.

Thus, the sample prepared for the measurement of the ferroelectric capacitor characteristics by using other etching equipment was put on the wafer stage 32, and then the performance of the capacitor was examined by setting the wafer stage 32 to the temperature of 400° C. and exposing the sample to the HBr plasma.

Figure 5:
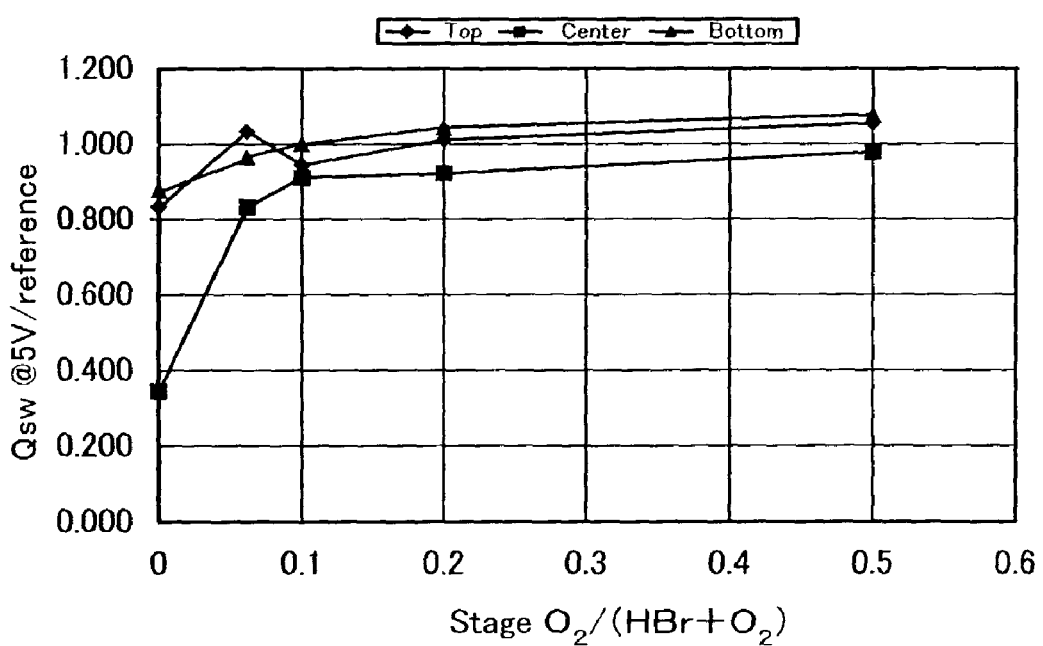
FIG. 5 is a graph showing a relationship between a quantity of polarization charge and an oxygen density when the capacitor of the semiconductor device according to the embodiment of the present invention is exposed to the mixed gas plasma consisting of HBr and oxygen.

In this case, when the pressure in the cylindrical adhesion preventing plate 34 was set to 0.5 Pa, the source power applied from the second high-frequency power supply 35 to the antenna coil 36 was set to 800 watt, the bias power applied from the first high-frequency power supply 33 to the electrode 36 was set to 0 watt, and a density of the oxygen supplied to the adhesion preventing plate 34 was changed in the range of 0% to 50%, results shown in FIG. 5 were obtained.

FIG. 5 shows a relationship between an $O_2$ density in the $HBr-O_2$ gas and a quantity of polarization charge $Q_{SW}$ indicating the performance of the ferroelectric capacitor. It is found that, if the ferroelectric capacitor is exposed to the HBr plasma, the performance of the ferroelectric capacitor is extremely lowered. However, it is also found that the deterioration of the capacitor can be suppressed by adding $O_2$ in excess of 10%. In this case, the quantity of polarization charge $Q_{SW}$ shown in FIG. 5 was derived when the voltage applied to the capacitor is set to ±5 V.

Here, if $O_2$ is mixed into HBr as the etching gas, the extreme reduction in the etching rate is anxious. For this reason, the etching rate was measured by using the etching equipment shown in FIG. 3 while changing the $O_2$ density in the $HBr-O_2$ gas.

In the measurement, the pressure in the cylindrical adhesion preventing plate 34 was set to 0.5 Pa, the source power applied from the second high-frequency power supply 35 to the antenna coil 36 was set to 800 watt, the bias power of the first high-frequency power supply 33 was set to 300 watt, and the $O_2$ density in the $HBr-O_2$ gas supplied to the adhesion preventing plate 34 was changed from 50% to 90%.

Figure 6:
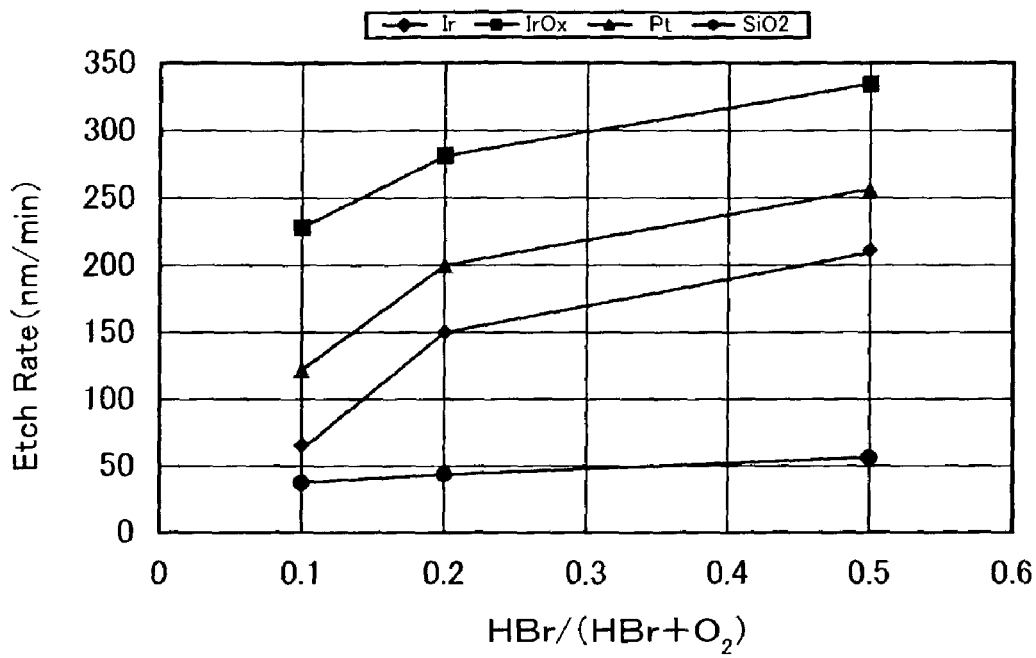
FIG. 6 is a graph showing a relationship between the etching rate and a HBr (or $O_2$) density when an iridium film, an iridium oxide film, and a platinum film, which are used in the capacitor electrode of the semiconductor device according to the embodiment of the present invention, and a silicon oxide film used as an insulating film are etched by the mixed gas plasma consisting of HBr and oxygen respectively.

In FIG. 6, respective etching rates of Ir, $IrO_x$, Pt, $SiO_2$ are shown when the $O_2$ density in the $HBr-O_2$ gas is changed. Even if the $O_2$ density is set to more than 80%, the sufficient etching rate could be obtained and thus there was no concerned extreme reduction in the etching rate. Accordingly, it is found that the mixed gas consisting of HBr and $O_2$ has the sufficient capability as the etchant.

Figure 7:
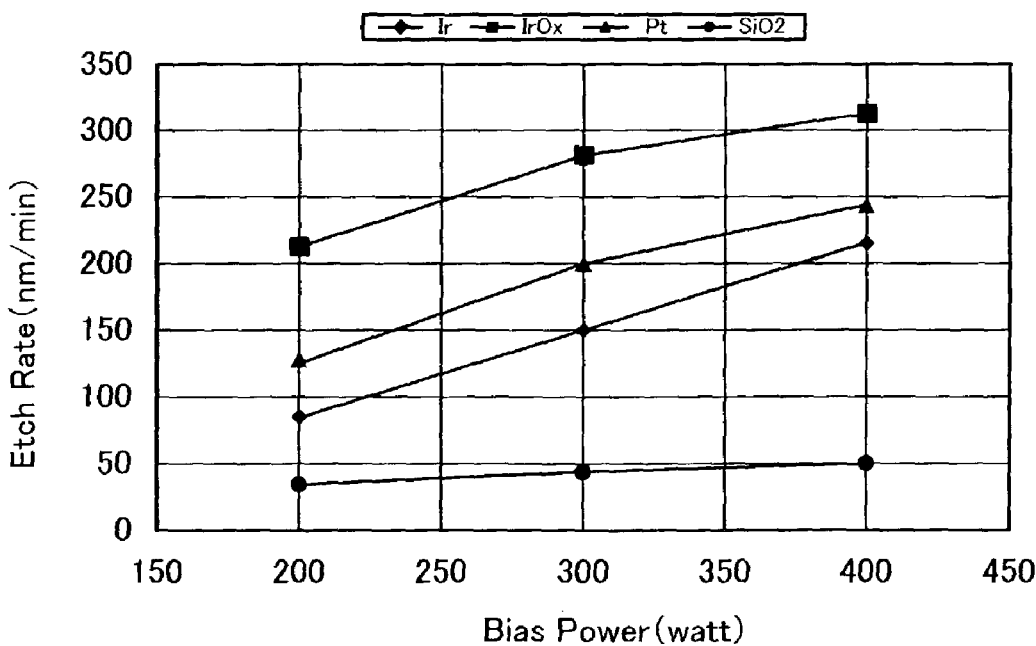
FIG. 7 is a graph showing a relationship between the etching rate and a bias power when the iridium film, the iridium oxide film, and the platinum film, which are used in the capacitor electrode of the semiconductor device according to the embodiment of the present invention, and the silicon oxide film used as the insulating film are etched by the mixed gas plasma consisting of HBr and the oxygen respectively.

In FIG. 7, respective etching rates of Ir, $IrO_x$, Pt, $SiO_2$ are shown when the bias power is changed while fixing the $O_2$ density in the $HBr-O_2$ gas generated in the etching atmosphere at 80%.

In the measurement of the etching rate, the pressure of the etching atmosphere was set to 0.5 Pa, the source power applied from the second high-frequency power supply 35 to the antenna coil 36 was set to 800 watt, the $O_2$ density in the $HBr-O_2$ gas supplied to the adhesion preventing plate 34 was set to 80%, and the bias power of the first high-frequency power supply 33 was changed from 200 watt to 400 watt. Accordingly, respective etching rates of Ir, $IrO_x$, Pt could be improved by increasing the bias power.

If the bias power is increased, the etching rate of the silicon oxide ($SiO_2$) film is increased and thus the reduction in the selective etching ratio of the conductive film to the silicon oxide film was anxious. However, as appreciated from FIG. 7, even when the bias power was increased, the etching rate of the silicon oxide film was not so increased. As a result, it was found that the selective etching ratio to the silicon oxide film can be improved by increasing the bias power.

In the normal etching, if the bias power is increased, the selective etching ratio of the conductive film to the silicon oxide film is remarkably lowered.

The relationship between the bias power and the selective etching ratio to the silicon oxide film, as shown in FIG. 7, was given as the phenomenon opposite to the normal state. But this may also be considered as the feature of the high-temperature etching.

According to such results, it was found that the highly-selective etching of the noble metal and its oxide can be achieved at the high etching rate by adjusting the bias power, etc. while using the mixed gas consisting of HBr and $O_2$. The $O_2$ density in the $HBr-O_2$ mixed gas must be set to at least 10% from a viewpoint of suppressing the deterioration of the capacitor performance. In addition, it is considered from a viewpoint of the etching rate that the $O_2$ density should be desirably set to less than 90%.

With the above, it was found that, if the stage temperature is set to the high temperature in excess of 300° C. by using the mixed gas containing HBr and $O_2$, the noble metal such as Ir, Pt or the like and its oxide employed as the electrode material for the ferroelectric capacitor or the high-dielectric capacitor can be etched at the high etching rate and selectively to $SiO_2$.

Since it was found that the electrode material can be etched by the mixed gas containing HBr and $O_2$, the etching of actual electrode materials was carried out. In this case, the $O_2$ density in the $HBr-O_2$ mixed gas must be set to at least 10% from the viewpoint of suppressing the deterioration of the capacitor performance.

In the course of the process of the experiment, it was found that the adhesion of the fence of the patterned conductive film and the side wall deposition can be suppressed by adding the oxygen, and also it was found that the effect of suppressing the fence and the side wall deposition is enhanced if the density of the oxygen becomes higher.

It is desirable from a viewpoint of the effect of suppressing the fence and the side wall deposition that the $O_2$ density in the $HBr-O_2$ mixed gas should be set to more than 80%. It is desirable from a viewpoint of the etching rate that the $O_2$ density should be set to less than 90%. As a result, it may be concluded that 80% to 90% is suitable for the $O_2$ density in the $HBr-O_2$ mixed gas.

Figure 8:
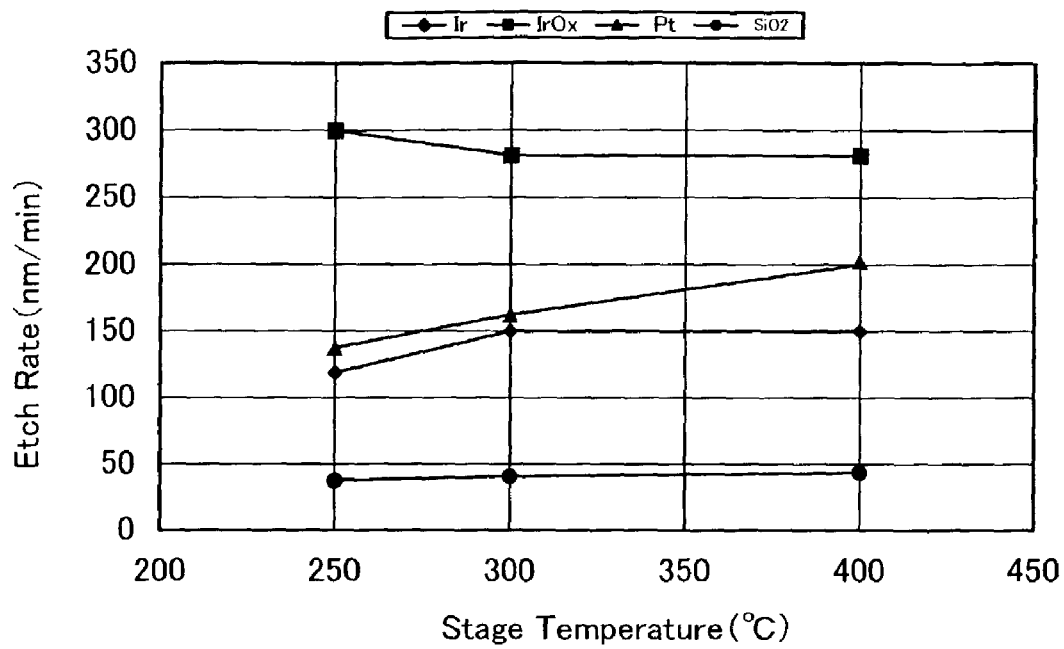
FIG. 8 is a graph showing a relationship between the etching rate and a wafer stage temperature when the iridium film, the iridium oxide film, and the platinum film, which are used in the capacitor electrode of the semiconductor device according to the embodiment of the present invention, and the silicon oxide film used as the insulating film are etched by the mixed gas plasma consisting of HBr and the oxygen respectively.

In FIG. 8, respective etching rates of Ir, $IrO_x$, Pt, $SiO_2$ are shown when the stage temperature was changed while fixing the $O_2$ density in the $HBr-O_2$ mixed gas plasma to 80%.

While using the ICP etching equipment shown in FIG. 3, the pressure in the cylindrical adhesion preventing plate 34 was set to 0.5 Pa, the source power applied from the second high-frequency power supply 35 to the antenna coil 36 was set to 800 watt, the bias power of the first high-frequency power supply 33 was set to 300 watt, the $O_2$ density in the $HBr-O_2$ gas supplied to the etching atmosphere was set to 80%, and the temperature of the wafer stage 32 was changed from 250° C. to 400° C. As the result, respective etching rates of Ir and Pt have the stage temperature dependency, and thus the etching based on the chemical reaction can be expected.

It was found that the electrode material can be etched by the chemical reaction using the mixed gas consisting of HBr and $O_2$. Therefore, the Ir film of 300 nm thickness, the $IrO_x$ film of 200 nm thickness, the Pt film of 300 nm thickness were etched sequentially as the sample, and then a relationship between the taper angle of the etched portions of these films and the wafer stage temperature was examined. The results are shown in FIG. 9.

Figure 9:
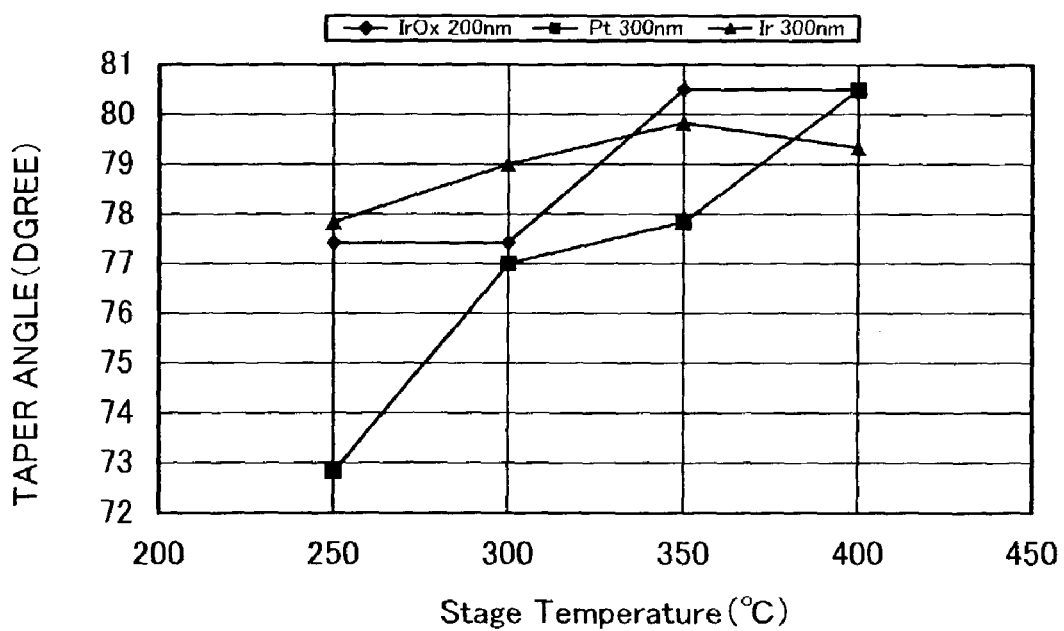
FIG. 9 is a graph showing a relationship between a taper angle of an etched side surface and the wafer stage temperature when the iridium film, the iridium oxide film, and the platinum film, which are used in the capacitor electrode of the semiconductor device according to the embodiment of the present invention, are etched by the mixed gas plasma consisting of HBr and $O_2$.
Figure 10A:
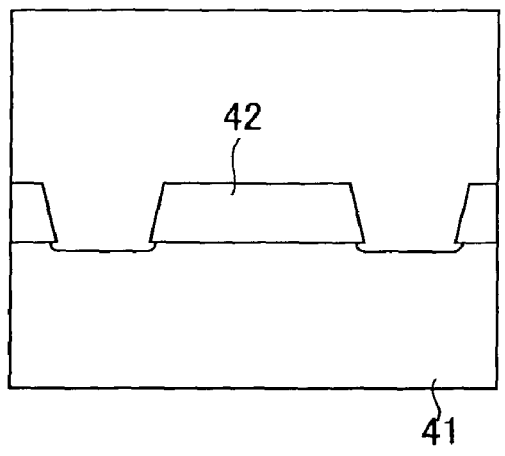
FIG. 10A is a perspective view illustrated based on a microphotograph taken after the iridium film used in the capacitor electrode of the semiconductor device according to the embodiment of the present invention is etched.
Figure 10B:
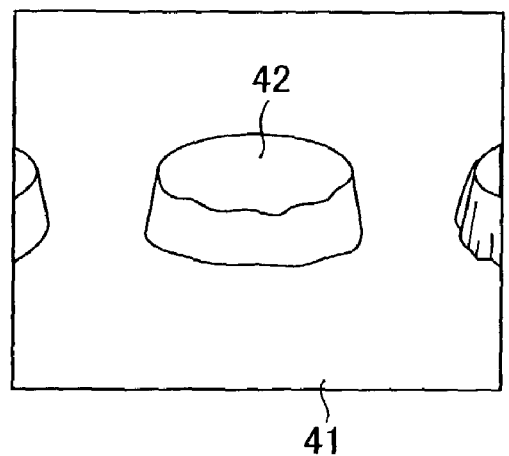
FIG. 10B is a sectional view of the same.
Figure 11A:
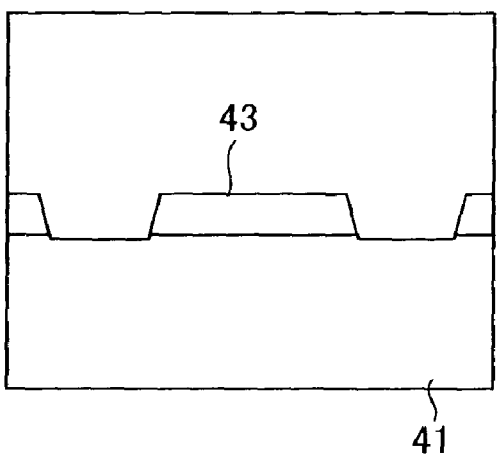
FIG. 11A is a perspective view illustrated based on a microphotograph taken after the iridium oxide film used in the capacitor electrode of the semiconductor device according to the embodiment of the present invention is etched.
Figure 11B:
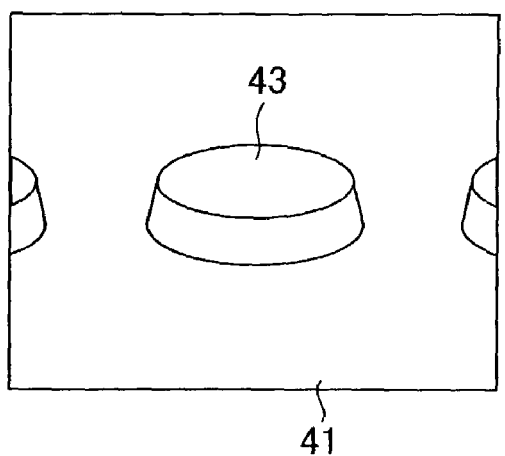
FIG. 11B is a sectional view of the same.
Figure 12A:
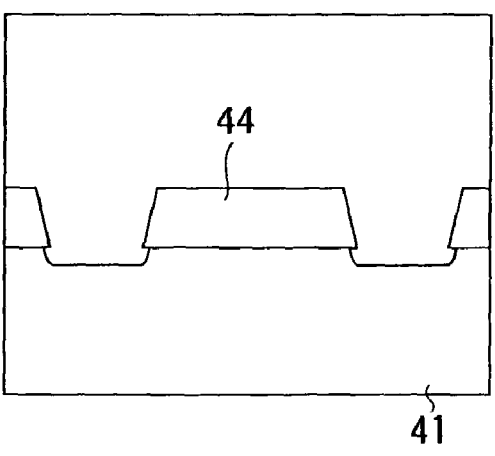
FIG. 12A is a perspective view illustrated based on a microphotograph taken after the platinum film used in the capacitor electrode of the semiconductor device according to the embodiment of the present invention is etched.
Figure 12B:
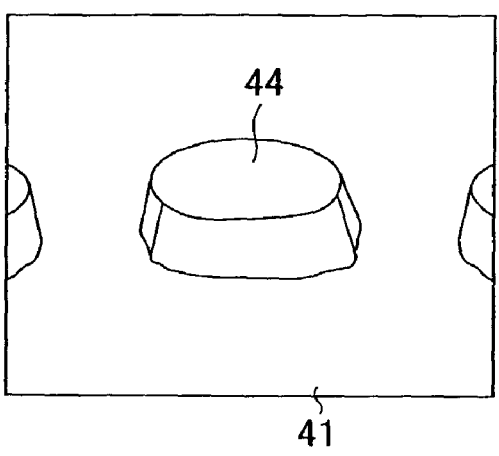
FIG. 12B is a sectional view of the same.

In the experiment in FIG. 9, the pressure in the cylindrical adhesion preventing plate 34 was set to 0.5 Pa, the source power applied from the second high-frequency power supply 35 to the antenna coil 36 was set to 800 watt, the bias power of the first high-frequency power supply 33 was set to 700 watt, the $O_2$ density in the $HBr-O_2$ gas supplied to the inside of the adhesion preventing plate 34 was set to 80%, and the temperature of the wafer stage 32 was changed from 250° C. to 400° C. Then, the taper angle of the etched portions of respective films was measured after the etching was carried out. Respective taper angles of the Ir film, the $IrO_x$ film, and the Pt film have the dependency on the stage temperature. If the stage temperature is set to more than 250° C., the taper angles of the Ir film and the $IrO_x$ film become more than 77 degree and come close to 80 degree as a temporary target value. The stage temperature for the Pt film must be set to more than 300° C. If the temperature of the wafer stage 32 is set to 400° C., the taper angle of almost 80 degree could be obtained in all material films. It was found that, if the temperature of the wafer stage is set higher than 400° C., the taper angle further comes close to 90 degree.

According to the above experiment, if the temperature of the wafer stage 32 is set high by using the mixed gas plasma consisting of HBr and $O_2$, the noble metal such as Ir, Pt or the like and its oxide used as the electrode material of the ferroelectric capacitor or the high-dielectric capacitor can be etched into the shape, which is close to the perpendicularity, without the formation of the fence.

If the stage temperature is set to less than 250° C., the etching rate of the electrode material is lowered and also the selective etching rate is lowered. Thus, the mask cannot be held and also the taper angle becomes gentle. If the stage temperature is set to more than 400° C., there are the problems such that the wafer cannot be held stably by the electrostatic chuck, etc. Accordingly, it may be concluded that 300° C. to 450° C. is desirable as the range of the stage temperature. The method of detecting the optimum value of the stage temperature for respective materials and changing the etching chamber every material may be thought about.

The etching. equipment is not limited to the above ICP type, and is not limited to the type using the electrostatic chuck. In the etching equipment in which the electrostatic chuck is not employed, the upper limit of the stage temperature is not 450° C. but 600° C. In case the PZT material is used as the dielectric film, Pb in the film is volatilized. Therefore, in view of the fact that the dielectric film is covered with the upper electrode, it is preferable from a viewpoint of preventing the deterioration of the film quality of the dielectric film that the upper limit of the temperature of the wafer stage should be set to 600° C.

Based on the above experimental result, in the state shown in FIG. 2F, in the step of etching the conductive films 15, 16 made of the material such as Ir, $IrO_x$, Pt, or the like while using the hard mask 18, the temperature of the wafer stage is set to the high temperature, for example, 300° C. to 450° C. and then the conductive films 15, 16 are etched by using the HBr gas or the mixed gas consisting HBr and $O_2$. The etching conditions are optimized in response to the file seed and the film thickness.

Next, an example in which the conditions are adjusted as follows and the etching rates under the conditions will be given. As the etching equipment in this case, the ICP plasma etching equipment shown in FIG. 3 was employed.

As the etching conditions, the pressure of the etching atmosphere was set to 0.5 Pa, the source power applied from the second high-frequency power supply 35 to the antenna coil 36 was set to 800 watt, the bias power of the first high-frequency power supply 33 was set to 700 watt, HBr and $O_2$ were supplied to the etching atmosphere at a flow rate of 10 sccm and 40 sccm respectively, and the temperature of the wafer stage 32 was set to 400° C . In this case, an amount of overetching was set to 100%. According to such etching conditions, the etching rate of the $IrO_x$ film was 372 nm/min, the etching rate of the Pt film was 331 nm/min, the etching rate of the Ir film was 322 nm/min, and the etching rate of the $SiO_2$ film was 49 nm/min.

FIGS. 10A and 10B, FIGS. 11A and 11B, and FIGS. 12A and 12B show shapes when a Ir film 42, a $IrO_x$ film 43, and a Pt film 44 on an underlying insulating film 41 are etched separately under such conditions.

In the above embodiment, the first conductive film, the ferroelectric film, and the second conductive film constituting the capacitor were etched successively by using one hard mask 18. But these films may be etched separately by using a plurality of masks. Also, the shape of the capacitor may be formed to have a level difference.

In the above embodiment, the formation of the FeRAM memory cell was explained. But the above etching method may be employed when the electrode of the capacitor, which employs the high-dielectric material as the dielectric film, is formed.

As described above, according to the present invention, when the conductive film made of the noble metal or its oxide is patterned into the electrode by using the mask and the etching, the perpendicular shape or the shape close to the perpendicularity to have the taper angle of the side surface of the electrode of more than 77 degree can be obtained by heating the semiconductor wafer to enhance the reactivity.

In addition, according to the present invention, the mixed gas consisting of HBr and $O_2$ or the $Br_2$ gas is supplied to the reaction atmosphere. Therefore, the side surface of the electrode employing the noble metal or its oxide can be shaped into the perpendicular shape or the shape close to the perpendicularity not to degrade the ferroelectric or high-dielectric capacitor and not to form the conductive fence on the side surface of the capacitor. As a result, the higher integration of the semiconductor device can be accelerated.

What is claimed is:

1. A manufacturing method of a semiconductor device comprising:

forming an insulating film over a semiconductor substrate;

forming a first conductive film over the insulating film;

forming a dielectric film made of one of ferroelectric material and high-dielectric material on the first conductive film;

forming a second conductive film on the dielectric film;

forming a mask having a capacitor shape on the second conductive film; and etching the second conductive film, the dielectric film, and the first conductive film, which are exposed from the mask, sequentially to shape the second conductive film into a capacitor upper electrode and shape the first conductive film into a capacitor lower electrode;

wherein at least the first conductive film is etched in a plasma atmosphere to which only hydrogen bromide and oxygen, in which a density of oxygen is set in equal or more than 80%, are supplied from a gas introducing pipe and a heating temperature of the semiconductor substrate is set by a heater in a range greater than 300° C. to 600° C. during the etching to obtain etched side surfaces having a greater than 77° angle with respect to a directly underlying surface without the formation of fences on the etched side surfaces; and wherein a chemical reaction of the etching is enhanced, in comparison to etching using gases other than only hydrogen bromide and oxygen, by not generating harmful etching products and thereby suppressing adhesion of etching products to an inside of a reaction chamber and sidewalls of the capacitor being formed.

2. A manufacturing method of a semiconductor device according to claim 1, wherein the mask is a hard mask.

3. A manufacturing method of a semiconductor device according to claim 1, wherein the semiconductor substrate is heated to said temperature of over 300° C. to 600° C. by direct contact to a heater.

4. The manufacturing method of a semiconductor device according to claim 1, wherein a density of the oxygen out of the hydrogen bromide and the oxygen is set in a range of 80% to 90%.

5. The manufacturing method of a semiconductor device according to claim 1, wherein a mask layer of TiN is formed directly on the upper surface of the second conductive film prior to etching.

6. The manufacturing method of a semiconductor device according to claim 1, wherein the heater and an electrostatic chuck constitute a wafer stage on which a wafer is arranged.

7. The manufacturing method of a semiconductor device according to claim 1, wherein said etching is performed by ICP plasma etching equipment.

* * * * *